(12) United States Patent
Petrzilek et al.

(10) Patent No.: US 11,049,664 B2
(45) Date of Patent: Jun. 29, 2021

(54) SOLID ELECTROLYTIC CAPACITOR CONTAINING A VAPOR-DEPOSITED BARRIER FILM

(71) Applicant: AVX Corporation, Fountain Inn, SC (US)

(72) Inventors: Jan Petrzilek, Usti nad Orlici (CZ); Mitchell D. Weaver, Simpsonville, SC (US); Miloslav Uher, Lanskoun (CZ)

(73) Assignee: AVX Corporation, Fountain Inn, SC (US)

( * ) Notice: Subject to any disclaimer, the term of this patent is extended or adjusted under 35 U.S.C. 154(b) by 31 days.

(21) Appl. No.: 16/368,939

(22) Filed: Mar. 29, 2019

(65) Prior Publication Data

US 2019/0318880 A1    Oct. 17, 2019

Related U.S. Application Data

(60) Provisional application No. 62/657,152, filed on Apr. 13, 2018.

(51) Int. Cl.
*H01G 9/052* (2006.01)
*C23C 16/02* (2006.01)
(Continued)

(52) U.S. Cl.
CPC ......... *H01G 9/052* (2013.01); *C23C 16/0245* (2013.01); *H01G 9/0032* (2013.01); *H01G 9/0036* (2013.01); *H01G 9/012* (2013.01); *H01G 9/025* (2013.01); *H01G 11/26* (2013.01); *H01G 9/15* (2013.01); *H01G 2009/05* (2013.01)

(58) Field of Classification Search
CPC ......... H01G 2009/0014; H01G 9/0029; H01G 9/0032; H01G 9/0036; H01G 9/025–032; H01G 11/56; H01G 9/07; H01G 11/26; H01G 9/04; H01G 2009/0412; H01G 9/0425; H01G 9/048; H01G 2009/05; H01G 9/052

See application file for complete search history.

(56) References Cited

U.S. PATENT DOCUMENTS 6,197,252 B1    3/2001  Bishop et al.
6,473,293 B2   10/2002  Shimada et al.
(Continued)

FOREIGN PATENT DOCUMENTS

CN      102768902 A    11/2012
JP      2005005134 A    1/2005
(Continued)

OTHER PUBLICATIONS

Atanasov et al., "Highly Conductive and Conformal Poly(3,4-ethylenedioxyatiophene) (PEDOT) Thin Films via Oxidative Molecular Layer Deposition," *American Chemical Society, Chem. Mater.*, 2014, pp. A-H.

(Continued)

*Primary Examiner* — Scott B Geyer
(74) *Attorney, Agent, or Firm* — Dority & Manning, P.A.

(57) ABSTRACT

A capacitor comprising a solid electrolytic capacitor element that contains a sintered porous anode body, a dielectric that overlies the anode body, and a solid electrolyte that overlies the dielectric. The capacitor further contains a barrier film that is formed by vapor deposition and that is positioned between the dielectric and the solid electrolyte or overlies the dielectric.

24 Claims, 2 Drawing Sheets

(51) Int. Cl.
*H01G 9/012* (2006.01)
*H01G 11/26* (2013.01)
*H01G 9/025* (2006.01)
*H01G 9/00* (2006.01)
*H01G 9/04* (2006.01)
*H01G 9/15* (2006.01)

(56) References Cited

U.S. PATENT DOCUMENTS

| | | |
|---|---|---|
| 6,551,873 B2 | 4/2003 | Park et al. |
| 6,731,495 B2 | 5/2004 | Kumar et al. |
| 6,987,663 B2 | 1/2006 | Merker et al. |
| 7,262,511 B2 | 8/2007 | Osako et al. |
| 7,350,281 B2 | 4/2008 | Schnetker |
| 7,379,290 B2 | 5/2008 | Toida et al. |
| 7,471,503 B2 | 12/2008 | Bruner et al. |
| 7,491,246 B2 | 2/2009 | Hossick-Schott et al. |
| 7,618,680 B2 | 11/2009 | Gleason et al. |
| 8,012,261 B2 | 9/2011 | Sneh |
| 8,125,768 B2 | 2/2012 | Horacek et al. |
| 8,313,538 B2 | 11/2012 | Merker et al. |
| 8,451,582 B2 | 5/2013 | Sneh et al. |
| 8,451,588 B2 | 5/2013 | Biler |
| 9,136,488 B2 | 9/2015 | Park et al. |
| 9,728,338 B2 | 8/2017 | Nagashima et al. |
| 10,256,045 B2 | 4/2019 | Saeki et al. |
| 2009/0040690 A1 | 2/2009 | Yasuda |
| 2011/0122546 A1 | 5/2011 | Nobuta et al. |
| 2011/0310526 A1 | 12/2011 | Sneh et al. |
| 2016/0104580 A1 | 4/2016 | Maeshima et al. |
| 2016/0329156 A1 | 11/2016 | Shacko et al. |
| 2020/0176194 A1 | 6/2020 | Petrzilek et al. |

FOREIGN PATENT DOCUMENTS

| | | |
|---|---|---|
| JP | 2005064352 A | 3/2005 |
| JP | 2008182098 A | 8/2008 |

OTHER PUBLICATIONS

Paper—Mundy et al., "ALD Coatings of High Surface Area Carbons for Electrochemical Capacitors," *NC State University*, Center of Dielectrics and Piezoelectrics, www.che.nesu.edu/losego, 20 pages.

Paper—Oldham et al., "Introduction to Atomic and Molecular Layer Deposition: Application Toward Depositing Highly Conductive PEDOT Coatings by Vapor Phase Processing," *NC State University, Department of Chemical and Biomolecular Engineering*, Aug. 13, 2014, pp. 1-32.

Paper—Parsons et al., "Atomic/Molecular Layer Deposition and Prospects for Roll-to-Roll Processing," *NC State Univerisity, Department of Chemical and Biomolecular Engineering*, Jun. 18, 2015, 25 pages.

Paper—"How ALD Compares with Other Deposition Techniques," *Sundew Technologies, LLC*, 2 pages.

Paper—"Selection of films grown by CVD, their applications and typical precursors used," *Overview of Chemical Vapour Deposition*, Chapter 1, pp. 23-26.

11,049,664 B2

SOLID ELECTROLYTIC CAPACITOR CONTAINING A VAPOR-DEPOSITED BARRIER FILM

CROSS REFERENCE TO RELATED APPLICATION

The present application claims filing benefit of U.S. Provisional Patent Application Ser. No. 62/657,152 having a filing date of Apr. 13, 2018, which is incorporated herein by reference in its entirety.

BACKGROUND OF THE INVENTION

Solid electrolytic capacitors (e.g., tantalum capacitors) are typically made by pressing a metal powder (e.g., tantalum) around a metal lead wire, sintering the pressed part, anodizing the sintered anode, and thereafter applying a solid electrolyte. Intrinsically conductive polymers are often employed as the solid electrolyte due to their advantageous low equivalent series resistance ("ESR") and "non-burning/non-ignition" failure mode. Such electrolytes can be formed through solution phase polymerization of a liquid monomer (e.g., 3,4-ethylenedioxythiopene, EDOT) in the presence of an oxidant (e.g., iron (III) toluene-sulphonate or iron (III) chloride) and a solvent (e.g., butanol). One of the problems with conventional capacitors that employ solution-polymerized conductive polymers is that they tend to fail at high voltages, such as experienced during a fast switch on or operational current spike. In an attempt to overcome some of these issues, premade conductive polymer slurries have also been employed in certain applications as an alternative solid electrolyte material. While some benefits have been achieved with these capacitors in high voltage environments, problems nevertheless remain. For instance, one problem with polymer slurry-based capacitors is that it is often difficult for the interior polymer layers, whether in situ polymerized or made from a polymer slurry, to penetrate and uniformly coat the pores of the anode. Not only does this reduce the points of contact between the electrolyte and dielectric, but it can also cause delamination of the polymer from the dielectric during mounting or use. As a result of these problems, it is often difficult to achieve ultralow ESR and/or leakage current values, particularly at relatively high voltages.

As such, a need currently exists for an improved electrolytic capacitor containing a conductive polymer solid electrolyte.

SUMMARY OF THE INVENTION

In accordance with one embodiment of the present invention, a capacitor is disclosed that comprises a solid electrolytic capacitor element that contains a sintered porous anode body, a dielectric that overlies the anode body, and a solid electrolyte that overlies the dielectric. The capacitor element further contains a barrier film that is formed by vapor deposition and that is positioned between the dielectric and the solid electrolyte or overlies the solid electrolyte.

In accordance with another embodiment of the present invention, a method for forming a solid electrolytic capacitor element is disclosed. The method comprises positioning a capacitor element with a reactor vessel, wherein the capacitor element comprises a sintered porous anode body and a dielectric overlying the anode body; forming a film on the capacitor element by a vapor deposition process, the process including subjecting the capacitor element to a reaction cycle that includes contacting the capacitor element with a gaseous precursor compound that bonds to a surface of the dielectric; and applying a solid electrolyte over the film.

In accordance with yet another embodiment of the present invention, a method for forming a solid electrolytic capacitor element is disclosed. The method comprises positioning a capacitor element with a reactor vessel, wherein the capacitor element comprises a sintered porous anode body and a dielectric overlying the anode body; applying a solid electrolyte over the dielectric; and forming a film on the capacitor element by a vapor deposition process, the process including subjecting the capacitor element to a reaction cycle that includes contacting the capacitor element with a gaseous precursor compound that bonds to the solid electrolyte.

Other features and aspects of the present invention are set forth in greater detail below.

BRIEF DESCRIPTION OF THE FIGURES

A full and enabling disclosure of the present invention, including the best mode thereof, directed to one of ordinary skill in the art, is set forth more particularly in the remainder of the specification, which makes reference to the appended figures in which.

Figure 1:
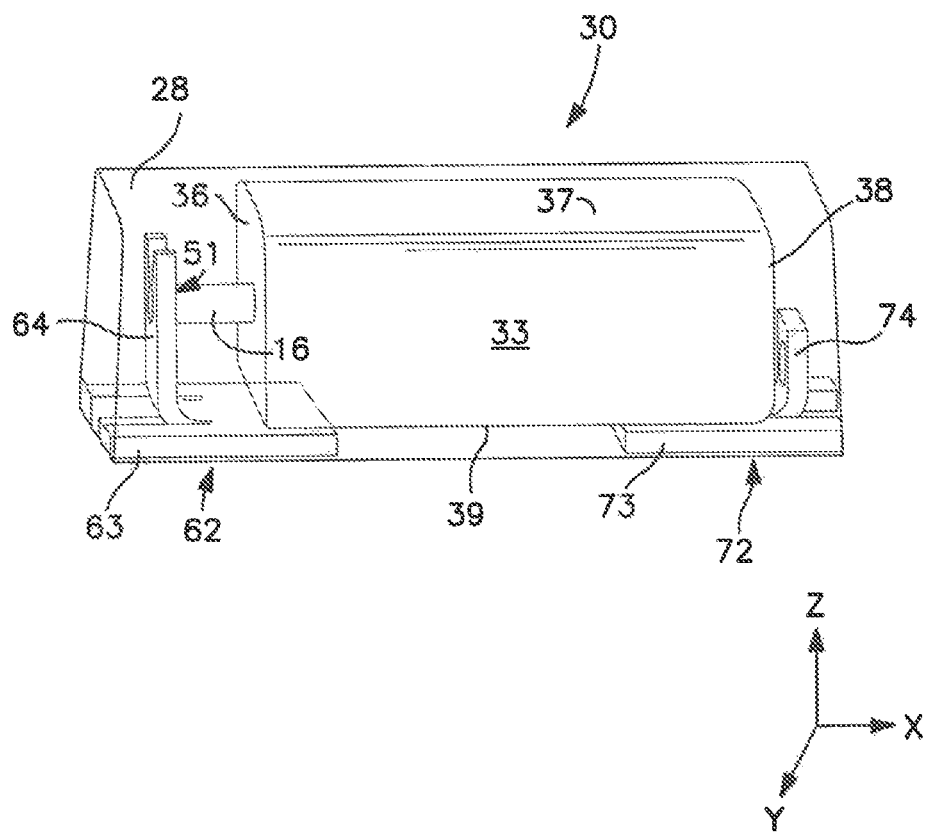
FIG. 1 is a schematic illustration of one embodiment of a capacitor that may be formed in accordance with the present invention.

Repeat use of references characters in the present specification and figures is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a solid electrolytic capacitor that contains a capacitor element including a sintered porous anode body, a dielectric overlying the anode body, and a solid electrolyte that overlies the dielectric. The capacitor element further includes a barrier film that is positioned between the dielectric and the solid electrolyte or overlies the solid electrolyte. The barrier film typically has a thickness of about 10 nanometers or more, in some embodiments from about 20 nanometers to about 1,000 nanometers, and in some embodiments, from about 30 nanometers to about 800 nanometers, and in some embodiments, from about 40 nanometers to about 500 nanometers. The barrier film is formed by vapor deposition, such as by physical vapor deposition (PVD), plasma-enhanced physical vapor deposition (PEPVD), chemical vapor deposition (CVD), plasma-enhanced chemical vapor deposition (PECVD), atomic layer deposition (ALD), molecular layer deposition (MLD), etc. Without intending to be limited by theory, it is believed that the use of such vapor-deposited materials in the barrier film can provide a variety of benefits to the resulting capacitor. For example, the capacitor may exhibit a high percentage of its wet capacitance, which enables it to have only a small capacitance loss and/or fluctuation in the presence of atmospheric humidity. This performance characteristic is quantified by the "wet-to-dry capacitance percentage", which is determined by the equation:

$$\text{Wet-to-Dry Capacitance} = (\text{Dry Capacitance}/\text{Wet Capacitance}) \times 100$$

The capacitor may exhibit a wet-to-dry capacitance percentage of about 50% or more, in some embodiments about 60% or more, in some embodiments about 70% or more, and in some embodiments, from about 80% to 100%. The dry capacitance may be about 30 nanoFarads per square centimeter ("nF/cm$^2$") or more, in some embodiments about 100 nF/cm$^2$ or more, in some embodiments from about 200 to about 3,000 nF/cm$^2$, and in some embodiments, from about 400 to about 2,000 nF/cm$^2$, measured at a frequency of 120 Hz and temperature of about 23° C. Capacitance may be measured using a Keithley 3330 Precision LCZ meter with Kelvin Leads with 2.2 volt DC bias and a 0.5 volt peak to peak sinusoidal signal.

The ESR of the resulting capacitor may likewise be relatively low, such as about 200 mohms or less, in some embodiments about 150 mohms or less, and in some embodiments, from about 0.1 to about 100 mohms, measured at an operating frequency of 100 kHz and temperature of about 23° C. Equivalence series resistance may be measured using a Keithley 3330 Precision LCZ meter with Kelvin Leads 2.2 volt DC bias and a 0.5 volt peak to peak sinusoidal signal. The unique nature of the barrier film can also allow the capacitor to better withstand a variety of different external conditions. Namely, the barrier film generally has a compact structure that is relatively nonporous. In this manner, the film may be generally impermeable to oxygen and/or resistant to condensation of water vapor molecules, which can have an adverse impact on electrical performance. For example, the capacitor can maintain good electrical properties even under extreme conditions, such as at high humidity levels, such as a relative humidity of about 40% or more, in some embodiments about 45% or more, in some embodiments about 50% or more, and in some embodiments, about 60% or more (e.g., about 60% to about 85%). Relative humidity may, for instance, be determined in accordance with ASTM E337-02, Method A (2007). The capacitor may, for instance, exhibit ESR values within the ranges noted above when exposed to the high humidity atmosphere (e.g., 60% relative humidity).

The capacitor may also exhibit a leakage current ("DCL") of about 50 microamps ("µA") or less, in some embodiments about 40 µA or less, in some embodiments about 20 µA or less, and in some embodiments, from about 0.1 to about 10 µA. Leakage current may be measured using a leakage test meter at a temperature of 23° C.±2° C. and at the rated voltage (e.g., 16 volts) after a minimum of 60 seconds (e.g., 180 seconds, 300 seconds). The dissipation factor of the capacitor may also be maintained at relatively low levels. The dissipation factor generally refers to losses that occur in the capacitor and is usually expressed as a percentage of the ideal capacitor performance. For example, the dissipation factor of the capacitor of the present invention is typically from about 1% to about 25%, in some embodiments from about 3% to about 15%, and in some embodiments, from about 5% to about 10%, as determined at a frequency of 120 Hz and temperature of about 23° C. The dissipation factor may be measured using a Keithley 3330 Precision LCZ meter with Kelvin Leads with 2.2 volt DC bias and a 0.5 volt peak to peak sinusoidal signal. The capacitor may also be able to be employed in high voltage applications, such as at rated voltages of about 35 volts or more, in some embodiments about 50 volts or more, and in some embodiments, from about 60 volts to about 300 volts. The capacitor may, for example, exhibit a relatively high "breakdown voltage" (voltage at which the capacitor fails), such as about 2 volts or more, in some embodiments about 5 volts or more, in some embodiments about 10 volts or more, in some embodiments about 30 volts or more, in some embodiments about 60 volts or more, and in some embodiments, from about 80 to about 300 volts.

Various embodiments of the capacitor will now be described in more detail.

I. Capacitor Element

A. Anode Body

The capacitor element generally includes a dielectric formed on a sintered porous body. The porous anode body may be formed from a powder that contains a valve metal (i.e., metal that is capable of oxidation) or valve metal-based compound, such as tantalum, niobium, aluminum, hafnium, titanium, alloys thereof, oxides thereof, nitrides thereof, and so forth. The powder is typically formed from a reduction process in which a tantalum salt (e.g., potassium fluotantalate ($K_2TaF_7$), sodium fluotantalate ($Na_2TaF_7$), tantalum pentachloride ($TaCl_5$), etc.) is reacted with a reducing agent. The reducing agent may be provided in the form of a liquid, gas (e.g., hydrogen), or solid, such as a metal (e.g., sodium), metal alloy, or metal salt. In one embodiment, for instance, a tantalum salt (e.g., $TaCl_5$) may be heated at a temperature of from about 900° C. to about 2,000° C., in some embodiments from about 1,000° C. to about 1,800° C., and in some embodiments, from about 1,100° C. to about 1,600° C., to form a vapor that can be reduced in the presence of a gaseous reducing agent (e.g., hydrogen). Additional details of such a reduction reaction may be described in WO 2014/199480 to Maeshima,etal. After the reduction, the product may be cooled, crushed, and washed to form a powder.

The specific charge of the powder typically varies from about 2,000 to about 800,000 microFarads*Volts per gram ("µF*V/g") depending on the desired application. As is known in the art, the specific charge may be determined by multiplying capacitance by the anodizing voltage employed, and then dividing this product by the weight of the anodized electrode body. For instance, a low charge powder may be employed that has a specific charge of from about 2,000 to about 70,000 µF*V/g, in some embodiments from about 5,000 to about 60,000 µF*V/g, and in some embodiments, from about 10,000 to about 50,000 µF*V/g. Such powders are particularly desirable for high voltage applications. Of course, in other embodiments, high charge powders may also be employed, such as those having a specific charge of from about 70,000 to about 800,000 µF*V/g, in some embodiments from about 80,000 to about 700,000 µF*V/g, and in some embodiments, from about 100,000 to about 600,000 µF*V/g.

The powder may be a free-flowing, finely divided powder that contains primary particles. The primary particles of the powder generally have a median size (D50) of from about 5 to about 500 nanometers, in some embodiments from about 10 to about 400 nanometers, and in some embodiments, from about 20 to about 250 nanometers, such as determined using a laser particle size distribution analyzer made by BECKMAN COULTER Corporation (e.g., LS-230), optionally after subjecting the particles to an ultrasonic wave vibration of 70 seconds. The primary particles typically have a three-dimensional granular shape (e.g., nodular or angular). Such particles typically have a relatively low "aspect ratio", which is the average diameter or width of the particles divided by the average thickness ("D/T"). For example, the aspect ratio of the particles may be about 4 or less, in some embodiments about 3 or less, and in some embodiments, from about 1 to about 2. In addition to primary particles, the powder may also contain other types of particles, such as secondary particles formed by aggregating (or agglomerating) the primary particles. Such secondary particles may have a median size (D50) of from about 1 to about 500 micrometers, and in some embodiments, from about 10 to about 250 micrometers.

Agglomeration of the particles may occur by heating the particles and/or through the use of a binder. For example, agglomeration may occur at a temperature of from about 0° C. to about 40° C., in some embodiments from about 5° C. to about 35° C., and in some embodiments, from about 15° C. to about 30° C. Suitable binders may likewise include, for instance, poly(vinyl butyral); poly(vinyl acetate); poly(vinyl alcohol); poly(vinyl pyrollidone); cellulosic polymers, such as carboxymethylcellulose, methyl cellulose, ethyl cellulose, hydroxyethyl cellulose, and methylhydroxyethyl cellulose; atactic polypropylene, polyethylene;

polyethylene glycol (e.g., Carbowax from Dow Chemical Co.); polystyrene, poly(butadiene/styrene); polyamides, polyimides, and polyacrylamides, high molecular weight polyethers; copolymers of ethylene oxide and propylene oxide; fluoropolymers, such as polytetrafluoroethylene, polyvinylidene fluoride, and fluoro-olefin copolymers; acrylic polymers, such as sodium polyacrylate, poly(lower alkyl acrylates), poly(lower alkyl methacrylates) and copolymers of lower alkyl acrylates and methacrylates; and fatty acids and waxes, such as stearic and other soapy fatty acids, vegetable wax, microwaxes (purified paraffins), etc.

The resulting powder may be compacted to form a pellet using any conventional powder press device. For example, a press mold may be employed that is a single station compaction press containing a die and one or multiple punches. Alternatively, anvil-type compaction press molds may be used that use only a die and single lower punch. Single station compaction press molds are available in several basic types, such as cam, toggle/knuckle and eccentric/crank presses with varying capabilities, such as single action, double action, floating die, movable platen, opposed ram, screw, impact, hot pressing, coining or sizing. The powder may be compacted around an anode lead, which may be in the form of a wire, sheet, etc. The lead may extend in a longitudinal direction from the anode body and may be formed from any electrically conductive material, such as tantalum, niobium, aluminum, hafnium, titanium, etc., as well as electrically conductive oxides and/or nitrides of thereof. Connection of the lead may also be accomplished using other known techniques, such as by welding the lead to the body or embedding it within the anode body during formation (e.g., prior to compaction and/or sintering).

Any binder may be removed after pressing by heating the pellet under vacuum at a certain temperature (e.g., from about 150° C. to about 500° C.) for several minutes. Alternatively, the binder may also be removed by contacting the pellet with an aqueous solution, such as described in U.S. Pat. No. 6,197,252 to Bishop,etal. Thereafter, the pellet is sintered to form a porous, integral mass. The pellet is typically sintered at a temperature of from about 700° C. to about 1900° C., in some embodiments from about 800° C. to about 1800° C., and in some embodiments, from about 900° C. to about 1600° C., for a time of from about 5 minutes to about 100 minutes, and in some embodiments, from about 8 minutes to about 15 minutes. This may occur in one or more steps. If desired, sintering may occur in an atmosphere that limits the transfer of oxygen atoms to the anode body. For example, sintering may occur in a reducing or inert atmosphere, such as in a vacuum, inert gas, hydrogen, etc. The atmosphere may be at a pressure of from about 10 Torr to about 2000 Torr, in some embodiments from about 100 Torr to about 1000 Torr, and in some embodiments, from about 100 Torr to about 930 Torr. Mixtures of hydrogen and other gases (e.g., argon or nitrogen) may also be employed.

B. Dielectric

The dielectric may be formed by anodically oxidizing ("anodizing") the sintered anode body so that a dielectric layer is formed over and/or within the body. For example, a tantalum (Ta) anode body may be anodized to tantalum pentoxide ($Ta_2O_5$). Typically, anodization is performed by initially applying a solution to the anode body, such as by dipping the anode body into the electrolyte.

A solvent is generally employed, such as water (e.g., deionized water). To enhance ionic conductivity, a compound may be employed that is capable of dissociating in the solvent to form ions. Examples of such compounds include, for instance, acids, such as described below with respect to the electrolyte. For example, an acid (e.g., phosphoric acid) may constitute from about 0.01 wt. % to about 5 wt. %, in some embodiments from about 0.05 wt. % to about 0.8 wt. %, and in some embodiments, from about 0.1 wt. % to about 0.5 wt. % of the anodizing solution. If desired, blends of acids may also be employed.

A current is passed through the anodizing solution to form the dielectric layer. The value of the formation voltage manages the thickness of the dielectric layer. For example, the power supply may be initially set up at a galvanostatic mode until the required voltage is reached. Thereafter, the power supply may be switched to a potentiostatic mode to ensure that the desired dielectric thickness is formed over the entire surface of the anode body. Of course, other known methods may also be employed, such as pulse or step potentiostatic methods. The voltage at which anodic oxidation occurs typically ranges from about 4 to about 400 V, and in some embodiments, from about 5 to about 300 V, and in some embodiments, from about 10 to about 200 V. During oxidation, the anodizing solution can be kept at an elevated temperature, such as about 30° C. or more, in some embodiments from about 40° C. to about 200° C., and in some embodiments, from about 50° C. to about 100° C. Anodic oxidation can also be done at ambient temperature or lower. The resulting dielectric layer may be formed on a surface of the anode body and within its pores.

Although not required, in certain embodiments, the dielectric layer may possess a differential thickness throughout the anode body in that it possesses a first portion that overlies an external surface of the anode body and a second portion that overlies an interior surface of the anode body. In such embodiments, the first portion is selectively formed so that its thickness is greater than that of the second portion. It should be understood, however, that the thickness of the dielectric layer need not be uniform within a particular region. Certain portions of the dielectric layer adjacent to the external surface may, for example, actually be thinner than certain portions of the layer at the interior surface, and vice versa. Nevertheless, the dielectric layer may be formed such that at least a portion of the layer at the external surface has a greater thickness than at least a portion at the interior surface. Although the exact difference in these thicknesses may vary depending on the particular application, the ratio of the thickness of the first portion to the thickness of the second portion is typically from about 1.2 to about 40, in some embodiments from about 1.5 to about 25, and in some embodiments, from about 2 to about 20.

To form a dielectric layer having a differential thickness, a multi-stage process may optionally be employed. In each stage of the process, the sintered anode body is anodically oxidized ("anodized") to form a dielectric layer (e.g., tantalum pentoxide). During the first stage of anodization, a relatively small forming voltage is typically employed to ensure that the desired dielectric thickness is achieved for the inner region, such as forming voltages ranging from about 1 to about 90 volts, in some embodiments from about 2 to about 50 volts, and in some embodiments, from about 5 to about 20 volts. Thereafter, the sintered body may then be anodically oxidized in a second stage of the process to increase the thickness of the dielectric to the desired level. This is generally accomplished by anodizing in an electrolyte at a higher voltage than employed during the first stage, such as at forming voltages ranging from about 50 to about 350 volts, in some embodiments from about 60 to about 300 volts, and in some embodiments, from about 70 to about 200 volts. During the first and/or second stages, the electrolyte may be kept at a temperature within the range of from about 15° C. to about 95° C., in some embodiments from about 20° C. to about 90° C., and in some embodiments, from about 25° C. to about 85° C.

The electrolytes employed during the first and second stages of the anodization process may be the same or different. Typically, however, it is desired to employ different solutions to help better facilitate the attainment of a higher thickness at the outer portions of the dielectric layer. For example, it may be desired that the electrolyte employed in the second stage has a lower ionic conductivity than the electrolyte employed in the first stage to prevent a significant amount of oxide film from forming on the internal surface of anode body. In this regard, the electrolyte employed during the first stage may contain an acidic compound, such as hydrochloric acid, nitric acid, sulfuric acid, phosphoric acid, polyphosphoric acid, boric acid, boronic acid, etc. Such an electrolyte may have an electrical conductivity of from about 0.1 to about 100 mS/cm, in some embodiments from about 0.2 to about 20 mS/cm, and in some embodiments, from about 1 to about 10 mS/cm, determined at a temperature of 25° C. The electrolyte employed during the second stage typically contains a salt of a weak acid so that the hydronium ion concentration increases in the pores as a result of charge passage therein. Ion transport or diffusion is such that the weak acid anion moves into the pores as necessary to balance the electrical charges. As a result, the concentration of the principal conducting species (hydronium ion) is reduced in the establishment of equilibrium between the hydronium ion, acid anion, and undissociated acid, thus forms a poorer-conducting species. The reduction in the concentration of the conducting species results in a relatively high voltage drop in the electrolyte, which hinders further anodization in the interior while a thicker oxide layer, is being built up on the outside to a higher formation voltage in the region of continued high conductivity. Suitable weak acid salts may include, for instance, ammonium or alkali metal salts (e.g., sodium, potassium, etc.) of boric acid, boronic acid, acetic acid, oxalic acid, lactic acid, adipic acid, etc. Particularly suitable salts include sodium tetraborate and ammonium pentaborate. Such electrolytes typically have an electrical conductivity of from about 0.1 to about 20 mS/cm, in some embodiments from about 0.5 to about 10 mS/cm, and in some embodiments, from about 1 to about 5 mS/cm, determined at a temperature of 25° C.

If desired, each stage of anodization may be repeated for one or more cycles to achieve the desired dielectric thickness. Furthermore, the anode body may also be rinsed or washed with another solvent (e.g., water) after the first and/or second stages to remove the electrolyte.

C. Solid Electrolyte

As indicated above, a solid electrolyte overlies the dielectric layer that generally functions as the cathode for the capacitor. The solid electrolyte may, for instance, contain one or more layers that include a conductive polymer. For example, the solid electrolyte typically contains from 2 to 30, in some embodiments from 4 to 20, and in some embodiments, from about 5 to 15 interior layers (e.g., 10 layers). Regardless of the number of layers employed, the resulting solid electrolyte typically has a total a thickness of from about 1 micrometer (µm) to about 200 µm, in some embodiments from about 2 µm to about 50 µm, and in some embodiments, from about 3 µm to about 30 µm.

The conductive polymer may be formed in a variety of ways, such as by vapor deposition, in situ solution phase polymerization, pre-polymerized conductive particles, etc. Regardless, the conductive polymer is typically π-conjugated and has electrical conductivity after oxidation or reduction, such as an electrical conductivity of at least about 1 µS/cm. Examples of such π-conjugated conductive polymers include, for instance, polyheterocycles (e.g., polypyrroles, polythiophenes, polyanilines, etc.), polyacetylenes, poly-p-phenylenes, polyphenolates, and so forth. In one embodiment, for example, the polymer is a substituted polythiophene having repeating units of the following general formula (I):

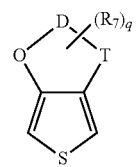

(I)

wherein,

T is O or S;

D is an optionally substituted $C_1$ to $C_5$ alkylene radical (e.g., methylene, ethylene, n-propylene, n-butylene, n-pentylene, etc.);

$R_7$ is a linear or branched, $C_1$ to $C_{18}$ alkyl radical (e.g., methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl, n-octadecyl, etc.); $C_5$ to $C_{12}$ cycloalkyl radical (e.g., cyclopentyl, cyclohexyl, cycloheptyl, cyclooctyl, cyclononyl, cyclodecyl, etc.); $C_6$ to $C_{14}$ aryl radical (e.g., phenyl, naphthyl, etc.); $C_7$ to $C_{18}$ aralkyl radical (e.g., benzyl, o-, m-, p-tolyl, 2,3-, 2,4-, 2,5-, 2-6, 3-4-, 3,5-xylyl, mesityl, etc.); and q is an integer from 0 to 8, in some embodiments, from 0 to 2, and in one embodiment, 0.

Example of substituents for the radicals "D" or "$R_7$" include, for instance, alkyl, cycloalkyl, aryl, aralkyl, alkoxy, halogen, ether, thioether, disulphide, sulfoxide, sulfone, sulfonate, amino, aldehyde, keto, carboxylic acid ester, carboxylic acid, carbonate, carboxylate, cyano, alkylsilane and alkoxysilane groups, carboxylamide groups, and so forth.

Particularly suitable thiophene polymers are those in which "D" is an optionally substituted $C_2$ to $C_3$ alkylene radical. For instance, the polymer may be optionally substituted poly(3,4-ethylenedioxythiophene), which has repeating units of the following general formula (II):

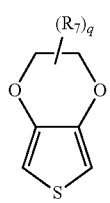

(II)

Such polymers may be formed from using a variety of different techniques, such as by in-situ solution polymerization, such as described in U.S. Pat. No. 6,987,663 to Merker, et al. To form such a layer, the precursor monomer may be dissolved in a solvent in the presence of an oxidative catalyst (e.g., chemically polymerized). The oxidative catalyst typically includes a transition metal cation, such as iron(III), copper(II), chromium(VI), cerium(IV), manganese (IV), manganese(VII), or ruthenium(III) cations, and etc. A dopant may also be employed to provide excess charge to the conductive polymer and stabilize the conductivity of the polymer. The dopant typically includes an inorganic or organic anion, such as an ion of a sulfonic acid. In certain embodiments, the oxidative catalyst has both a catalytic and doping functionality in that it includes a cation (e.g., transition metal) and an anion (e.g., sulfonic acid). For example, the oxidative catalyst may be a transition metal salt that includes iron(III) cations, such as iron(III) halides (e.g., $FeCl_3$) or iron(III) salts of other inorganic acids, such as $Fe(ClO_4)_3$ or $Fe_2(SO_4)_3$ and the iron(III) salts of organic acids and inorganic acids comprising organic radicals. Examples of iron (III) salts of inorganic acids with organic radicals include, for instance, iron(III) salts of sulfuric acid monoesters of $C_1$ to $C_{20}$ alkanols (e.g., iron(III) salt of lauryl sulfate). Likewise, examples of iron(III) salts of organic acids include, for instance, iron(III) salts of $C_1$ to $C_{20}$ alkane sulfonic acids (e.g., methane, ethane, propane, butane, or dodecane sulfonic acid); iron (III) salts of aliphatic perfluorosulfonic acids (e.g., trifluoromethane sulfonic acid, perfluorobutane sulfonic acid, or perfluorooctane sulfonic acid); iron (III) salts of aliphatic $C_1$ to $C_{20}$ carboxylic acids (e.g., 2-ethylhexylcarboxylic acid); iron (III) salts of aliphatic perfluorocarboxylic acids (e.g., trifluoroacetic acid or perfluorooctane acid); iron (III) salts of aromatic sulfonic acids optionally substituted by $C_1$ to $C_{20}$ alkyl groups (e.g., benzene sulfonic acid, o-toluene sulfonic acid, p-toluene sulfonic acid, or dodecylbenzene sulfonic acid); iron (III) salts of cycloalkane sulfonic acids (e.g., camphor sulfonic acid); and so forth. Mixtures of these above-mentioned iron(III) salts may also be used. Iron(III)-p-toluene sulfonate, iron(III)-o-toluene sulfonate, and mixtures thereof, are particularly suitable. One commercially suitable example of iron(III)-p-toluene sulfonate is available from Heraeus under the designation Clevios™ C.

The oxidative catalyst and precursor monomer may be applied either sequentially or together to initiate the polymerization reaction within the solution phase. Suitable application techniques for applying these components include screen-printing, dipping, electrophoretic coating, and spraying. As an example, the monomer may initially be mixed with the oxidative catalyst to form a precursor solution. Once the mixture is formed, it may be applied to the capacitor element and then allowed to polymerize so that a conductive coating is formed on the surface. Alternatively, the oxidative catalyst and monomer may be applied sequentially. In one embodiment, for example, the oxidative catalyst is dissolved in an organic solvent (e.g., butanol) and then applied as a dipping solution. The part may then be dried to remove the solvent therefrom. Thereafter, the part may be dipped into a solution containing the monomer. Regardless, polymerization is typically performed at temperatures of from about −10° C. to about 250° C., and in some embodiments, from about 0° C. to about 200° C., depending on the oxidizing agent used and desired reaction time.

Besides in situ solution phase polymerization, the conductive polymer layer(s) may also be formed in other ways. For example, one or more of such layers may be formed from pre-polymerized intrinsically and/or extrinsically conductive polymer particles. One benefit of employing such particles is that they can minimize the presence of ionic species (e.g., $Fe^{2+}$ or $Fe^{3+}$) produced during conventional in situ polymerization processes, which can cause dielectric breakdown under high electric field due to ionic migration. Thus, by applying the conductive polymer as pre-polymerized particles rather through in situ polymerization, the resulting capacitor may exhibit a relatively high "breakdown voltage." In one particular embodiment, for example, the outer layer(s) are formed primarily from such conductive polymer particles in that they constitute about 50 wt. % or more, in some embodiments about 70 wt. % or more, and in some embodiments, about 90 wt. % or more (e.g., 100 wt. %) of a respective outer layer.

The particles are typically formed from a π-conjugated conductive polymer as described above, such as a polyheterocycle (e.g., polypyrrole, polythiophene, polyaniline, etc.), polyacetylene, poly-p-phenylene, polyphenolate, and so forth. Poly(3,4-ethylenedioxythiopene) ("PEDT") and derivatives thereof may be particularly suitable. If desired, a separate counterion may be employed that is not covalently bound to the polymer. The counterion may be a monomeric or polymeric anion that counteracts the charge of the conductive polymer. Polymeric anions can, for example, be anions of polymeric carboxylic acids (e.g., polyacrylic acids, polymethacrylic acid, polymaleic acids, etc.); polymeric sulfonic acids (e.g., polystyrene sulfonic acids ("PSS"), polyvinyl sulfonic acids, etc.); and so forth. The acids may also be copolymers, such as copolymers of vinyl carboxylic and vinyl sulfonic acids with other polymerizable monomers, such as acrylic acid esters and styrene. Likewise, suitable monomeric anions include, for example, anions of $C_1$ to $C_{20}$ alkane sulfonic acids (e.g., dodecane sulfonic acid); aliphatic perfluorosulfonic acids (e.g., trifluoromethane sulfonic acid, perfluorobutane sulfonic acid or perfluorooctane sulfonic acid); aliphatic $C_1$ to $C_{20}$ carboxylic acids (e.g., 2-ethyl-hexylcarboxylic acid); aliphatic perfluorocarboxylic acids (e.g., trifluoroacetic acid or perfluorooctanoic acid); aromatic sulfonic acids optionally substituted by $C_1$ to $C_{20}$ alkyl groups (e.g., benzene sulfonic acid, o-toluene sulfonic acid, p-toluene sulfonic acid or dodecylbenzene sulfonic acid); cycloalkane sulfonic acids (e.g., camphor sulfonic acid or tetrafluoroborates, hexafluorophosphates, perchlorates, hexafluoroantimonates, hexafluoroarsenates or hexachloroantimonates); and so forth. Particularly suitable counteranions are polymeric anions, such as a polymeric carboxylic or sulfonic acid (e.g., polystyrene sulfonic acid ("PSS")). The molecular weight of such polymeric anions typically ranges from about 1,000 to about 2,000,000, and in some embodiments, from about 2,000 to about 500,000.

Regardless of the particular nature of the polymer, the conductive polymer particles used to form the interior layer(s) typically have an average size (e.g., diameter) of from about 1 to about 80 nanometers, in some embodiments from about 2 to about 70 nanometers, and in some embodiments, from about 3 to about 60 nanometers. The diameter of the particles may be determined using known techniques, such as by ultracentrifuge, laser diffraction, etc. The shape of the particles may likewise vary. In one particular embodiment, for instance, the particles are spherical in shape. However, it should be understood that other shapes are also contemplated by the present invention, such as plates, rods, discs, bars, tubes, irregular shapes, etc.

Although not necessarily required, the conductive polymer particles may be applied in the form of a dispersion. The concentration of the conductive polymer in the dispersion may vary depending on the desired viscosity of the dispersion and the particular manner in which the dispersion is to be applied to the capacitor element. Typically, however, the polymer constitutes from about 0.1 to about 10 wt. %, in some embodiments from about 0.4 to about 5 wt. %, and in some embodiments, from about 0.5 to about 4 wt. % of the dispersion. The dispersion may also contain one or more components to enhance the overall properties of the resulting solid electrolyte. For example, the dispersion may contain a binder to further enhance the adhesive nature of the polymeric layer and also increase the stability of the particles within the dispersion. The binder may be organic in nature, such as polyvinyl alcohols, polyvinyl pyrrolidones, polyvinyl chlorides, polyvinyl acetates, polyvinyl butyrates, polyacrylic acid esters, polyacrylic acid amides, polymethacrylic acid esters, polymethacrylic acid amides, polyacrylonitriles, styrene/acrylic acid ester, vinyl acetate/acrylic acid ester and ethylene/vinyl acetate copolymers, polybutadienes, polyisoprenes, polystyrenes, polyethers, polyesters, polycarbonates, polyurethanes, polyamides, polyimides, polysulfones, melamine formaldehyde resins, epoxide resins, silicone resins or celluloses. Dispersion agents may also be employed to facilitate the ability to apply the layer to the capacitor element. Suitable dispersion agents include solvents, such as aliphatic alcohols (e.g., methanol, ethanol, i-propanol and butanol), aliphatic ketones (e.g., acetone and methyl ethyl ketones), aliphatic carboxylic acid esters (e.g., ethyl acetate and butyl acetate), aromatic hydrocarbons (e.g., toluene and xylene), aliphatic hydrocarbons (e.g., hexane, heptane and cyclohexane), chlorinated hydrocarbons (e.g., dichloromethane and dichloroethane), aliphatic nitriles (e.g., acetonitrile), aliphatic sulfoxides and sulfones (e.g., dimethyl sulfoxide and sulfolane), aliphatic carboxylic acid amides (e.g., methylacetamide, dimethylacetamide and dimethylformamide), aliphatic and araliphatic ethers (e.g., diethylether and anisole), water, and mixtures of any of the foregoing solvents. A particularly suitable dispersion agent is water.

In addition to those mentioned above, still other ingredients may also be used in the dispersion. For example, conventional fillers may be used that have a size of from about 10 nanometers to about 100 micrometers, in some embodiments from about 50 nanometers to about 50 micrometers, and in some embodiments, from about 100 nanometers to about 30 micrometers. Examples of such fillers include calcium carbonate, silicates, silica, calcium or barium sulfate, aluminum hydroxide, glass fibers or bulbs, wood flour, cellulose powder carbon black, electrically conductive polymers, etc. The fillers may be introduced into the dispersion in powder form, but may also be present in another form, such as fibers.

Surface-active substances may also be employed in the dispersion, such as ionic or non-ionic surfactants. Furthermore, adhesives may be employed, such as organofunctional silanes or their hydrolysates, for example 3-glycidoxypropyltrialkoxysilane, 3-am inopropyl-triethoxysilane, 3-mercaptopropyl-trimethoxysilane, 3-metacryloxypropylt-rimethoxysilane, vinyltrimethoxysilane or octyltriethoxysilane. The dispersion may also contain additives that increase conductivity, such as ether group-containing compounds (e.g., tetrahydrofuran), lactone group-containing compounds (e.g., γ-butyrolactone or γ-valerolactone), amide or lactam group-containing compounds (e.g., caprolactam, N-methylcaprolactam, N,N-dimethylacetamide, N-methylacetamide, N,N-dimethylformamide (DMF), N-methylformamide, N-methylformanilide, N-methylpyrrolidone (NMP), N-octylpyrrolidone, or pyrrolidone), sulfones and sulfoxides (e.g., sulfolane (tetramethylenesulfone) or dimethylsulfoxide (DMSO)), sugar or sugar derivatives (e.g., saccharose, glucose, fructose, or lactose), sugar alcohols (e.g., sorbitol or mannitol), furan derivatives (e.g., 2-furancarboxylic acid or 3-furancarboxylic acid), an alcohols (e.g., ethylene glycol, glycerol, di- or triethylene glycol).

The dispersion may be applied using a variety of known techniques, such as by spin coating, impregnation, pouring, dropwise application, injection, spraying, doctor blading, brushing, printing (e.g., ink-jet, screen, or pad printing), or dipping. The viscosity of the dispersion is typically from about 0.1 to about 100,000 mPas (measured at a shear rate of 100 s$^{-1}$), in some embodiments from about 1 to about 10,000 mPas, in some embodiments from about 10 to about 1,500 mPas, and in some embodiments, from about 100 to about 1000 mPas.

If desired, an external polymer coating may also be employed in the solid electrolyte that contains one or more layers formed from a conductive polymer such as described above. In one embodiment, the external coating is formed from pre-polymerized conductive polymer particles (e.g., dispersion of extrinsically conductive polymer particles). The external coating may be able to further penetrate into the edge region of the capacitor body to increase the adhesion to the dielectric and result in a more mechanically robust part, which may reduce equivalent series resistance and leakage current. Because it is generally intended to improve the degree of edge coverage rather to impregnate the interior of the capacitor element, the particles used in the external coating typically have a larger size than those employed in the interior layers of the solid electrolyte. For example, the ratio of the average size of the particles employed in the external polymer coating to the average size of the particles employed in a dispersion used to form the interior layers of the solid electrolyte is typically from about 1.5 to about 30, in some embodiments from about 2 to about 20, and in some embodiments, from about 5 to about 15. For example, the particles employed in the dispersion of the external coating may have an average size of from about 80 to about 500 nanometers, in some embodiments from about 90 to about 250 nanometers, and in some embodiments, from about 100 to about 200 nanometers.

If desired, a crosslinking agent may also be employed in the external polymer coating to enhance the degree of adhesion to the solid electrolyte. When employed, such crosslinking agents are applied prior to application of the dispersion used in the external coating. Suitable crosslinking agents are described, for instance, in U.S. Patent Publication No. 2007/0064376 to Merker,etal. and include, for instance, amines (e.g., diamines, triamines, oligomer amines, polyamines, etc.); polyvalent metal cations, such as salts or compounds of Mg, Al, Ca, Fe, Cr, Mn, Ba, Ti, Co, Ni, Cu, Ru, Ce or Zn, phosphonium compounds, sulfonium compounds, etc. Particularly suitable examples include, for instance, 1,4-diaminocyclohexane, 1,4-bis(amino-methyl) cyclohexane, ethylenediamine, 1,6-hexanediamine, 1,7-heptanediamine, 1,8-octanediamine, 1,9-nonanediamine, 1,10-decanediamine, 1,12-dodecanediamine, N,N-dimethylethylenediamine, N,N,N',N'-tetramethylethylenediamine, N,N,N',N'-tetramethyl-1,4-butanediamine, etc., as well as mixtures thereof. The crosslinking agent is typically applied from a solution or dispersion whose pH is from 1 to 10, in some embodiments from 2 to 7, in some embodiments, from 3 to 6, as determined at 25° C. Acidic compounds may be employed to help achieve the desired pH level. Examples of solvents or dispersants for the crosslinking agent include water or organic solvents, such as alcohols, ketones, carboxylic esters, etc. The crosslinking agent may be applied to the capacitor body by any known process, such as spin-coating, impregnation, casting, dropwise application, spray application, vapor deposition, sputtering, sublimation, knife-coating, painting or printing, for example inkjet, screen or pad printing. Once applied, the crosslinking agent may be dried prior to application of the polymer dispersion. This process may then be repeated until the desired thickness is achieved. For example, the total thickness of the entire external polymer coating, including the crosslinking agent and dispersion layers, may range from about 1 to about 50 µm, in some embodiments from about 2 to about 40 µm, and in some embodiments, from about 5 to about 20 µm.

D. Barrier Film

A barrier film is also employed in the capacitor element. The barrier film may be positioned between the dielectric and the solid electrolyte. Likewise, the barrier film may also overly the solid electrolyte in that it covers at least one layer of the solid electrolyte. For instance, the barrier film may be formed between the interior layers and external coating of the solid electrolyte and/or it may cover the entire solid electrolyte. Multiple barrier films may also be employed if desired. Regardless, at least one barrier film is formed by vapor deposition, such as by physical vapor deposition (PVD), plasma-enhanced physical vapor deposition (PEPVD), chemical vapor deposition (CVD), plasma-enhanced chemical vapor deposition (PECVD), atomic layer deposition (ALD), molecular layer deposition (MLD), etc. Such processes typically involve the polymerization of a precursor gaseous compound to form a coating in situ on the capacitor. The precursor compound may be provided in a gaseous state, which is then polymerized in situ to deposit a polymer coating. The precursor compound may also be provided in a liquid or solid state, in which case it is generally vaporized into a gaseous compound and then reacted in situ to deposit the coating.

In certain embodiments, for instance, plasma-enhanced vapor deposition may be employed. Such a process is typically carried out in a reactor that generates a plasma, which may include ionized gaseous ions, electrons, atoms and/or neutral species. The reactor typically includes a chamber, an optional vacuum system, and one or more energy sources, although any suitable type of reactor configured to generate a gas plasma may be used. The energy source may include any suitable device configured to convert one or more gases to a gas plasma, such as a heater, radio frequency generator, microwave generator, etc. To form the barrier film, the capacitor element may, for instance, be placed in the chamber of a reactor and a vacuum system may be used to pump the chamber down to pressures in the range of $10^{-3}$ to 10 mbar. One or more gases may then be pumped into the chamber and an energy source may generate the gas plasma. Thereafter, the precursor compound may be introduced into the gas plasma-containing chamber. When introduced in this manner, the precursor compound is typically ionized and/or decomposed to generate a range of active species in the plasma that generates the desired film structure. During such a process, the plasma drive frequency may be from 1 kHz to 1 GHz, the plasma power may be from 100 to 250 W, the mass flow rate may be from 5 to 100 seconds per cubic centimeter (sccm), the operating pressure may be from 10 to 100 mTorr, and the coating time may be from 10 seconds to 20 minutes. Of course, one skilled in the art would readily understand that the particular conditions will be dependent on the size and geometry of the plasma chamber.

In yet other embodiments, a sequential vapor deposition may be employed in which a precursor compound and co-reactant are sequentially contacted with the surface of the capacitor element. Particularly suitable sequential techniques include, for instance, atomic layer deposition (ALD), molecular layer deposition (MLD), etc. In such a sequential process, a capacitor element may be initially exposed to the gaseous precursor compound so that it reacts and bonds to the exposed surface without fully decomposing. Thereafter, a co-reactant may be exposed to the growth surface where it reacts with the deposited precursor compound. Once the reaction is complete, any remaining vapor byproducts may be removed (e.g., with an inert gas) and the capacitor element may then be subjected to additional sequential reaction cycles to achieve the target film thickness. One benefit of such a process is that the half-reactions are self-limiting. Namely, once the precursor compound has reacted with sites prepared during a previous co-reactant exposure, the surface reaction will stop because the surface sites prepared by the precursor reaction are reactive to the co-reactant, but not the precursor compound itself. This means that during steady state growth, the precursor compound will typically deposit at most only one monolayer (e.g., molecular fragment) during each half-reaction cycle even when the surface is exposed to the reactant species for a substantial period of time. Among other things, this allows the formation of a thin film coating that is conformal over the entire surface of the exposed surface, which in turn, can improve various properties of the capacitor.

The precursor compound may vary depending on the type of material that is employed within the barrier film. In one embodiment, for instance, the material may be a polymer, which is typically not electrically conductive. In one embodiment, for instance, the precursor compound may be a polyarylene compound having the following general structure:

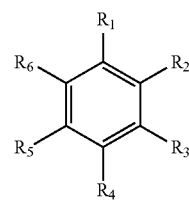

wherein, $R_1$ is alkyl, alkenyl, halo (e.g., chloro, fluoro, bromo, etc.), or haloalkyl (e.g., $CF_2$); and $R_2$, $R_3$, $R_4$, $R_5$, and $R_6$ are independently selected from hydrogen, alkyl, alkenyl, halo, or haloalkyl, wherein one or more of $R_1$, $R_2$, $R_3$, $R_4$, $R_5$, or $R_6$ (e.g., $R_1$ and/or $R_4$) may be optionally bonded with another polyarylene ring (e.g., alkyl functional groups attached to the ring structure) to form a dimer. In certain embodiments, the alkyl may include linear or branched hydrocarbon radicals having 1 to 3 carbon atoms, and in some embodiments, 1 to 2 carbon atoms. Examples include methyl, ethyl, n-propyl and isopropyl. The alkenyl may likewise include linear or branched hydrocarbon radicals having 2 or 3 carbon atoms and a carbon-carbon double bond. One example is vinyl. For instance, $R_1$ may be methyl or vinyl (e.g., methyl), $R_2$ may be hydrogen, methyl or vinyl (e.g., hydrogen); $R_3$ may be hydrogen, methyl or vinyl (e.g., hydrogen); $R_4$ may be hydrogen, methyl or vinyl (e.g., hydrogen or methyl); $R_5$ may be hydrogen, methyl or vinyl (e.g., hydrogen); and/or $R_6$ may be hydrogen, methyl or vinyl (e.g., hydrogen). Particularly suitable paraylene compounds include, for instance, 1,4-dimethylbenzene ("paraxylylene" or "Paraylene N"), 1,3-dimethylbenzene, 1,2-dimethylbenzene, toluene, 4-methyl styrene, 3-methylstyrene, 2-methylstyrene, 1,4-divinylbenzene, 1,3-divinylbenzene, 1,2-divinylbenzene, chlorinated polyarylene ("Polyarylene C" or "Polyarylene D"), etc. As noted above, the polyarylene compound may also be a dimer in which one or more of the "R groups" of the arylene structure referenced above are bonded with a group of another arylene structure. One example of such a polyarylene dimer is [2,2]paracylcophane.

If desired, a co-reactant may also be employed to form the polymer film. The co-reactant may vary depending on the particular type of reaction involved for forming the barrier film. For example, the co-reactant may be a fluorohydrocarbon, which is a hydrocarbon material comprising fluorine atoms. Particularly suitable fluorohydrocarbon compounds include, for instance, perfluoroalkanes, perfluoroalkenes, perfluoroalkynes, fluoroalkanes, fluoroalkenes, fluoroalkynes, etc. Typically, such compounds contain up to 10 carbon atoms, in some embodiments, up to five carbon atoms. Examples of such compounds include, for instance, $CF_4$, $C_2F_4$, $C_2F_6$, $C_3F_6$, $C_3F_8$, etc.

To deposit the barrier film, it is generally desirable to subject the capacitor element to multiple cycles within a reactor vessel. For instance, in a typical reaction cycle, a gaseous precursor compound may be supplied to a reactor vessel and allowed to react with the exposed surface of a dielectric and/or a material employed within the solid electrolyte. A co-reactant may optionally be supplied to the vessel and allowed to react with the deposited precursor compound. Additional cycles may then be repeated to achieve the target thickness, which is typically about 10 nanometers or more, in some embodiments from about 20 nanometers to about 1,000 nanometers, and in some embodiments, from about 30 nanometers to about 800 nanometers, and in some embodiments, from about 40 nanometers to about 500 nanometers.

In one embodiment, for instance, a reaction cycle is initiated by first heating the capacitor element to a certain deposition temperature. Although the particular deposition temperature for a given reaction cycle can vary based on a variety of factors, one particular benefit of the technique employed in the present invention is that relatively low temperatures can be employed. For example, the deposition temperature may be about 200° C. or less, in some embodiments about 175° C. or less, and in some embodiments, from about 100° C. to about 160° C. (e.g., about 150° C.). The reactor vessel pressure during deposition is also typically from about 0.01 to about 5 Torr, in some embodiments from about 0.1 to about 3 Torr, and in some embodiments, from about 0.3 to about 2 Torr (e.g., about 1 Torr). While the capacitor element is maintained at the deposition temperature and pressure, the gas precursor compound may be supplied to the reactor vessel via an inlet for a certain deposition time period and at a certain flow rate. The gas precursor flow rate can vary, but is typically from about 1 standard cubic centimeter per minute to about 1 liter per minute. After reacting with the surface of the capacitor element, an inert gas (e.g., nitrogen, argon, helium, etc.) may be supplied to the reactor vessel to purge it from gases and vapor byproducts. A gaseous co-reactant may then optionally be supplied to the reactor vessel through an inlet, which may be the same or different than the inlet used for the precursor compound. The co-reactant flow rate can vary, but is typically between about 1 standard cubic centimeter per minute to about 1 standard liter per minute. The temperature and/or pressure within the reaction vessel during deposition of the precursor compound and co-reactant may be the same or different, but is typically within the ranges noted above. As a result of a reaction cycle, such as described above, one or multiple layers of the barrier film (e.g., polymer) can form near the interface with the adjacent layer on the capacitor element (e.g., dielectric or solid electrolyte) and thus, are referred to herein as "interfacial" layer(s). As noted above, additional layers can also be formed on these interfacial layer(s) by utilizing one or more additional reaction cycles during which a precursor compound and optional co-reactant are supplied and react on the surface.

Figure 2:
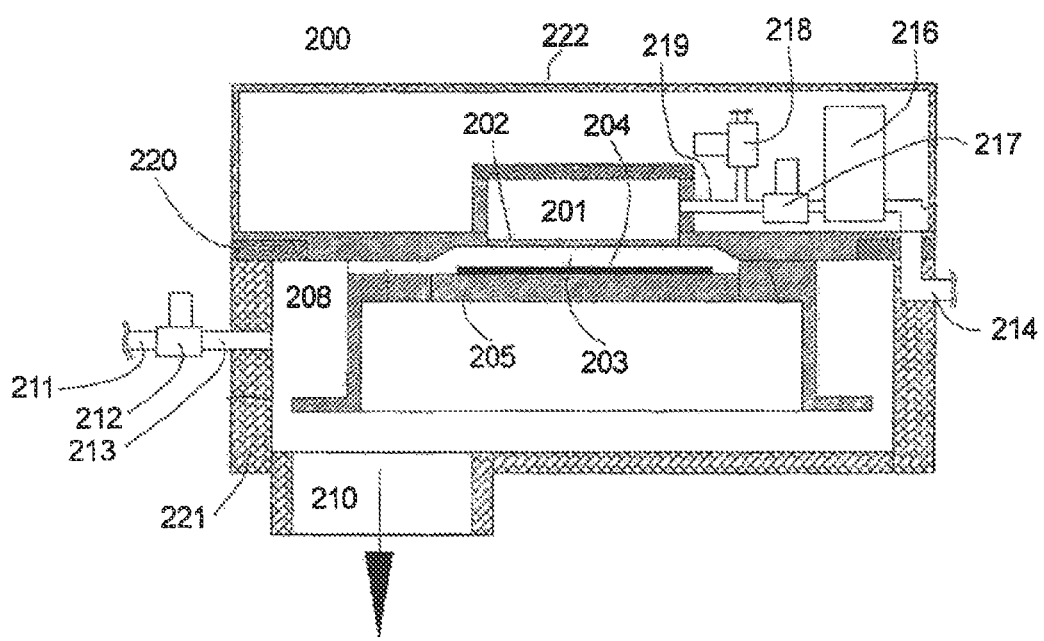
FIG. 2 is a cross-sectional view of one embodiment of a sequential vapor deposition system that may be employed in the present invention.

Various known vapor deposition systems may generally be employed to sequentially form the adhesive film of the present invention. Referring to FIG. 2, for instance, one embodiment of a suitable vapor deposition system is shown that is described in more detail in U.S. Pat. No. 8,012,261 to Sneh, which is incorporated herein in its entirety by reference thereto. More particularly, the system includes a reactor vessel 200 that contains sidewalls 221 and a top 222 that together define a gas distribution chamber 201 that is capable of supplying a gaseous compound to a deposition chamber 203 via a flow-restricting element 202 (e.g., nozzle array). A capacitor element 204 may be positioned on a substrate holder 205, which is typically made from a thermally conductive material, such as tungsten, molybdenum, aluminum, nickel, etc. The holder 205 may be heated so that the capacitor element 204 is capable of reaching the desired temperature during a reaction cycle. A gas inlet 214 is provided to supply the precursor compound and optional co-reactant to the reactor vessel 200 via a line 219. If desired, a booster chamber 216 may be employed in combination with a shut-off valve 217 and a purge-exhaust shut-off valve 218. Also, a thermal barrier 220 may be employed to inhibit thermal conductance between the sidewalls 221 and the top 222. If desired, a draw gas may be employed to help purge gases from the reactor vessel when desired. For instance, gases may flow from the deposition chamber 203 into a draw control chamber 208 and to a vacuum port 210. A draw gas flows through a draw-gas line 211, draw-source shut-off valve 212, and draw-source line 213 through the draw control chamber 208 to manage a draw pressure in the draw control chamber 208.

E. Other Components

The capacitor may also employ a cathode coating that overlies the solid electrolyte and optionally the barrier film.

The cathode coating may contain a metal particle layer includes a plurality of conductive metal particles dispersed within a resinous polymer matrix. The particles typically constitute from about 50 wt. % to about 99 wt. %, in some embodiments from about 60 wt. % to about 98 wt. %, and in some embodiments, from about 70 wt. % to about 95 wt. % of the layer, while the resinous polymer matrix typically constitutes from about 1 wt. % to about 50 wt. %, in some embodiments from about 2 wt. % to about 40 wt. %, and in some embodiments, from about 5 wt. % to about 30 wt. % of the layer. The conductive metal particles may be formed from a variety of different metals, such as copper, nickel, silver, nickel, zinc, tin, lead, copper, aluminum, molybdenum, titanium, iron, zirconium, magnesium, etc., as well as alloys thereof. Silver is a particularly suitable conductive metal for use in the layer. The metal particles often have a relatively small size, such as an average size of from about 0.01 to about 50 micrometers, in some embodiments from about 0.1 to about 40 micrometers, and in some embodiments, from about 1 to about 30 micrometers. Typically, only one metal particle layer is employed, although it should be understood that multiple layers may be employed if so desired. The total thickness of such layer(s) is typically within the range of from about 1 μm to about 500 μm, in some embodiments from about 5 μm to about 200 μm, and in some embodiments, from about 10 μm to about 100 μm.

The resinous polymer matrix typically includes a polymer, which may be thermoplastic or thermosetting in nature. Typically, however, the polymer is selected so that it can act as a barrier to electromigration of silver ions, and also so that it contains a relatively small amount of polar groups to minimize the degree of water adsorption in the cathode coating. In this regard, the present inventors have found that vinyl acetal polymers are particularly suitable for this purpose, such as polyvinyl butyral, polyvinyl formal, etc. Polyvinyl butyral, for instance, may be formed by reacting polyvinyl alcohol with an aldehyde (e.g., butyraldehyde). Because this reaction is not typically complete, polyvinyl butyral will generally have a residual hydroxyl content. By minimizing this content, however, the polymer can possess a lesser degree of strong polar groups, which would otherwise result in a high degree of moisture adsorption and result in silver ion migration. For instance, the residual hydroxyl content in polyvinyl acetal may be about 35 mol. % or less, in some embodiments about 30 mol. % or less, and in some embodiments, from about 10 mol. % to about 25 mol. %. One commercially available example of such a polymer is available from Sekisui Chemical Co., Ltd. under the designation "BH—S" (polyvinyl butyral).

To form the cathode coating, a conductive paste is typically applied to the capacitor that overlies the solid electrolyte. One or more organic solvents are generally employed in the paste. A variety of different organic solvents may generally be employed, such as glycols (e.g., propylene glycol, butylene glycol, triethylene glycol, hexylene glycol, polyethylene glycols, ethoxydiglycol, and dipropyleneglycol); glycol ethers (e.g., methyl glycol ether, ethyl glycol ether, and isopropyl glycol ether); ethers (e.g., diethyl ether and tetrahydrofuran); alcohols (e.g., benzyl alcohol, methanol, ethanol, n-propanol, iso-propanol, and butanol); triglycerides; ketones (e.g., acetone, methyl ethyl ketone, and methyl isobutyl ketone); esters (e.g., ethyl acetate, butyl acetate, diethylene glycol ether acetate, and methoxypropyl acetate); amides (e.g., dimethylformamide, dimethylacetamide, dimethylcaprylic/capric fatty acid amide and N-alkylpyrrolidones); nitriles (e.g., acetonitrile, propionitrile, butyronitrile and benzonitrile); sulfoxides or sulfones (e.g., dimethyl sulfoxide (DMSO) and sulfolane); etc., as well as mixtures thereof. The organic solvent(s) typically constitute from about 10 wt. % to about 70 wt. %, in some embodiments from about 20 wt. % to about 65 wt. %, and in some embodiments, from about 30 wt. % to about 60 wt. %. of the paste. Typically, the metal particles constitute from about 10 wt. % to about 60 wt. %, in some embodiments from about 20 wt. % to about 45 wt. %, and in some embodiments, from about 25 wt. % to about 40 wt. % of the paste, and the resinous polymer matrix constitutes from about 0.1 wt. % to about 20 wt. %, in some embodiments from about 0.2 wt. % to about 10 wt. %, and in some embodiments, from about 0.5 wt. % to about 8 wt. % of the paste.

The paste may have a relatively low viscosity, allowing it to be readily handled and applied to a capacitor element. The viscosity may, for instance, range from about 50 to about 3,000 centipoise, in some embodiments from about 100 to about 2,000 centipoise, and in some embodiments, from about 200 to about 1,000 centipoise, such as measured with a Brookfield DV-1 viscometer (cone and plate) operating at a speed of 10 rpm and a temperature of 25° C. If desired, thickeners or other viscosity modifiers may be employed in the paste to increase or decrease viscosity. Further, the thickness of the applied paste may also be relatively thin and still achieve the desired properties. For example, the thickness of the paste may be from about 0.01 to about 50 micrometers, in some embodiments from about 0.5 to about 30 micrometers, and in some embodiments, from about 1 to about 25 micrometers. Once applied, the metal paste may be optionally dried to remove certain components, such as the organic solvents. For instance, drying may occur at a temperature of from about 20° C. to about 150° C., in some embodiments from about 50° C. to about 140° C., and in some embodiments, from about 80° C. to about 130° C.

If desired, the capacitor may also contain other layers as is known in the art. In certain embodiments, for instance, a carbon layer (e.g., graphite) may be positioned between the solid electrolyte and the silver layer that can help further limit contact of the silver layer with the solid electrolyte.

II. Terminations

Once the layers of the capacitor element are formed, the resulting capacitor may be provided with terminations. For example, the capacitor may contain an anode termination to which an anode lead of the capacitor element is electrically connected and a cathode termination to which the cathode of the capacitor is electrically connected. Any conductive material may be employed to form the terminations, such as a conductive metal (e.g., copper, nickel, silver, nickel, zinc, tin, palladium, lead, copper, aluminum, molybdenum, titanium, iron, zirconium, magnesium, and alloys thereof). Particularly suitable conductive metals include, for instance, copper, copper alloys (e.g., copper-zirconium, copper-magnesium, copper-zinc, or copper-iron), nickel, and nickel alloys (e.g., nickel-iron). The thickness of the terminations is generally selected to minimize the thickness of the capacitor. For instance, the thickness of the terminations may range from about 0.05 to about 1 millimeter, in some embodiments from about 0.05 to about 0.5 millimeters, and from about 0.07 to about 0.2 millimeters. One exemplary conductive material is a copper-iron alloy metal plate available from Wieland (Germany). If desired, the surface of the terminations may be electroplated with nickel, silver, gold, tin, etc. as is known in the art to ensure that the final part is mountable to the circuit board. In one particular embodiment, both surfaces of the terminations are plated with nickel and silver flashes, respectively, while the mounting surface is also plated with a tin solder layer.

The terminations may be connected to the capacitor element using any technique known in the art. In one embodiment, for example, a lead frame may be provided that defines the cathode termination and anode termination. To attach the electrolytic capacitor element to the lead frame, a conductive adhesive may initially be applied to a surface of the cathode termination. The conductive adhesive may include, for instance, conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and compound (e.g., silane compounds). Suitable conductive adhesives may be described in U.S. Patent Application Publication No. 2006/0038304 to Osako,etal. Any of a variety of techniques may be used to apply the conductive adhesive to the cathode termination. Printing techniques, for instance, may be employed due to their practical and cost-saving benefits. The anode lead may also be electrically connected to the anode termination using any technique known in the art, such as mechanical welding, laser welding, conductive adhesives, etc. Upon electrically connecting the anode lead to the anode termination, the conductive adhesive may then be cured to ensure that the electrolytic capacitor element is adequately adhered to the cathode termination.

Referring to FIG. 1, for example, the electrolytic capacitor 30 is shown as including an anode termination 62 and a cathode termination 72 in electrical connection with the capacitor element 33 having an upper surface 37, lower surface 39, rear surface 38, and front surface 36. Although it may be in electrical contact with any of the surfaces of the capacitor element 33, the cathode termination 72 in the illustrated embodiment is in electrical contact with the lower surface 39 via a conductive adhesive. More specifically, the cathode termination 72 contains a first component 73 that is in electrical contact and generally parallel with the lower surface 39 of the capacitor element 33. The cathode termination 72 may also contain a second component 74 that is substantially perpendicular to the first component 73 and in electrical contract with the rear surface 38 of the capacitor element 33. The anode termination 62 likewise contains a first component 63 positioned substantially perpendicular to a second component 64. The first component 63 is in electrical contact and generally parallel with the lower surface 39 of the capacitor element 33. The second component 64 contains a region 51 that carries an anode lead 16. Although not depicted in FIG. 1, the region 51 may possess a "U-shape" to further enhance surface contact and mechanical stability of the lead 16.

The terminations may be connected to the capacitor element using any technique known in the art. In one embodiment, for example, a lead frame may be provided that defines the cathode termination 72 and anode termination 62. To attach the electrolytic capacitor element 33 to the lead frame, the conductive adhesive may initially be applied to a surface of the cathode termination 72. The conductive adhesive may include, for instance, conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and coupling agent (e.g., silane coupling agents). Suitable conductive adhesives may be described in U.S. Patent Publication No. 2006/0038304 to Osako,etal. Any of a variety of techniques may be used to apply the conductive adhesive to the cathode termination 72. Printing techniques, for instance, may be employed due to their practical and cost-saving benefits.

A variety of methods may generally be employed to attach the terminations to the capacitor. In one embodiment, for example, the second component 64 of the anode termination 62 is initially bent upward to the position shown in FIG. 1. Thereafter, the capacitor element 33 is positioned on the cathode termination 72 so that its lower surface 39 contacts the adhesive and the anode lead 16 is received by the region 51. If desired, an insulating material (not shown), such as a plastic pad or tape, may be positioned between the lower surface 39 of the capacitor element 33 and the first component 63 of the anode termination 62 to electrically isolate the anode and cathode terminations.

The anode lead 16 is then electrically connected to the region 51 using any technique known in the art, such as mechanical welding, laser welding, conductive adhesives, etc. For example, the anode lead 16 may be welded to the anode termination 62 using a laser. Lasers generally contain resonators that include a laser medium capable of releasing photons by stimulated emission and an energy source that excites the elements of the laser medium. One type of suitable laser is one in which the laser medium consist of an aluminum and yttrium garnet (YAG), doped with neodymium (Nd). The excited particles are neodymium ions $Nd^{3+}$. The energy source may provide continuous energy to the laser medium to emit a continuous laser beam or energy discharges to emit a pulsed laser beam. Upon electrically connecting the anode lead 16 to the anode termination 62, the conductive adhesive may then be cured. For example, a heat press may be used to apply heat and pressure to ensure that the electrolytic capacitor element 33 is adequately adhered to the cathode termination 72 by the adhesive.

III. Housing

Due to the ability of the capacitor to exhibit good electrical performance in various environments, it is not necessary for the capacitor element to be hermetically sealed within a housing. Nevertheless, in certain embodiments, it may be desired to hermetically seal the capacitor element within a housing. The capacitor element may be sealed within a housing in various ways. In certain embodiments, for instance, the capacitor element may be enclosed within a case, which may then be filled with a resinous material, such as a thermoset resin (e.g., epoxy resin) that can be cured to form a hardened housing. Examples of such resins include, for instance, epoxy resins, polyimide resins, melamine resins, urea-formaldehyde resins, polyurethane resins, phenolic resins, polyester resins, etc. Epoxy resins are also particularly suitable. Still other additives may also be employed, such as photoinitiators, viscosity modifiers, suspension aiding agents, pigments, stress reducing agents, non-conductive fillers, stabilizers, etc. For example, the non-conductive fillers may include inorganic oxide particles, such as silica, alumina, zirconia, magnesium oxide, iron oxide, copper oxide, zeolites, silicates, clays (e.g., smectite clay), etc., as well as composites (e.g., alumina-coated silica particles) and mixtures thereof. Regardless, the resinous material may surround and encapsulate the capacitor element so that at least a portion of the anode and cathode terminations are exposed for mounting onto a circuit board. When encapsulated in this manner, the capacitor element and resinous material form an integral capacitor. As shown in FIG. 1, for instance, the capacitor element 33 is encapsulated within a housing 28 so that a portion of the anode termination 62 and a portion of the cathode termination 72 are exposed.

Of course, in alternative embodiments, it may be desirable to enclose the capacitor element within a housing that remains separate and distinct. In this manner, the atmosphere of the housing may be gaseous and contain at least one inert gas, such as nitrogen, helium, argon, xenon, neon, krypton, radon, and so forth, as well as mixtures thereof. Typically, inert gases constitute the majority of the atmosphere within the housing, such as from about 50 wt. % to 100 wt. %, in some embodiments from about 75 wt. % to 100 wt. %, and in some embodiments, from about 90 wt. % to about 99 wt. % of the atmosphere. If desired, a relatively small amount of non-inert gases may also be employed, such as carbon dioxide, oxygen, water vapor, etc. In such cases, however, the non-inert gases typically constitute 15 wt. % or less, in some embodiments 10 wt. % or less, in some embodiments about 5 wt. % or less, in some embodiments about 1 wt. % or less, and in some embodiments, from about 0.01 wt. % to about 1 wt. % of the atmosphere within the housing. Any of a variety of different materials may be used to form the separate housing, such as metals, plastics, ceramics, and so forth. In one embodiment, for example, the housing includes one or more layers of a metal, such as tantalum, niobium, aluminum, nickel, hafnium, titanium, copper, silver, steel (e.g., stainless), alloys thereof (e.g., electrically conductive oxides), composites thereof (e.g., metal coated with electrically conductive oxide), and so forth. In another embodiment, the housing may include one or more layers of a ceramic material, such as aluminum nitride, aluminum oxide, silicon oxide, magnesium oxide, calcium oxide, glass, etc., as well as combinations thereof. The housing may have any desired shape, such as cylindrical, D-shaped, rectangular, triangular, prismatic, etc.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for forming a solid electrolytic capacitor element, the method comprising:
   positioning a capacitor element within a reactor vessel, wherein the capacitor element comprises a sintered porous anode body and a dielectric overlying the anode body;
   forming a barrier film on the capacitor element by a vapor deposition process, the process including subjecting the capacitor element to a reaction cycle that includes contacting the capacitor element with a gaseous precursor compound that bonds to a surface of the dielectric; and
   applying a solid electrolyte over the film.

2. The method of claim 1, wherein the vapor deposition process includes atomic layer deposition, molecular layer deposition, physical vapor deposition, plasma-enhanced physical vapor deposition, chemical vapor deposition, plasma-enhanced chemical vapor deposition, or a combination thereof.

3. The method of claim 1, wherein precursor compound includes a polyarylene.

4. The method of claim 3, wherein the polyarylene has the following general structure:

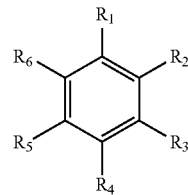

wherein,
   $R_1$ is alkyl, alkenyl, halo, or haloalkyl; and
   $R_2$, $R_3$, $R_4$, $R_5$, and $R_6$ are independently selected from hydrogen, alkyl, alkenyl, halo, or haloalkyl, wherein one or more of $R_1$, $R_2$, $R_3$, $R_4$, $R_5$, or $R_6$ are optionally bonded with a second polyarylene ring structure to form a dimer.

5. The method of claim 3, wherein the polyarylene is 1,4-dimethylbenzene, 1,3-dimethylbenzene, 1,2-dimethylbenzene, toluene, 4-methyl styrene, 3-methylstyrene, 2-methylstyrene, 1,4-divinylbenzene, 1,3-divinylbenzene, 1,2-divinylbenzene, chlorinated polyarylene, [2,2]paracylcophane, or a combination thereof.

6. The method of claim 1, wherein the reaction cycle further comprises contacting the capacitor element with a gaseous co-reactant.

7. The method of claim 6, wherein the co-reactant includes a fluorohydrocarbon compound.

8. The method of claim 1, wherein the capacitor element is heated to a temperature of about 200° C. or less during the reaction cycle.

9. The method of claim 1, further comprising subjecting the capacitor element to one or more additional reaction cycles that include contacting the capacitor element with a gaseous precursor compound.

10. The method of claim 1, wherein the solid electrolyte includes a layer formed from a dispersion of conductive polymer particles.

11. The method of claim 1, wherein the solid electrolyte includes a layer formed by solution phase polymerization.

12. The method of claim 1, wherein the anode body includes tantalum and the dielectric includes tantalum pentoxide.

13. A method for forming a solid electrolytic capacitor element, the method comprising:
   positioning a capacitor element within a reactor vessel, wherein the capacitor element comprises a sintered porous anode body and a dielectric overlying the anode body;
   applying a solid electrolyte over the dielectric; and
   forming a barrier film on the capacitor element by a vapor deposition process, the process including subjecting the capacitor element to a reaction cycle that includes contacting the capacitor element with a gaseous precursor compound that bonds to the solid electrolyte.

14. The method of claim 13, wherein the vapor deposition process includes atomic layer deposition, molecular layer deposition, physical vapor deposition, plasma-enhanced physical vapor deposition, chemical vapor deposition, plasma-enhanced chemical vapor deposition, or a combination thereof.

15. The method of claim 13, wherein precursor compound includes a polyarylene.

16. The method of claim 15, wherein the polyarylene has the following general structure:

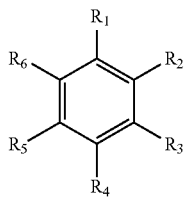

wherein,
$R_1$ is alkyl, alkenyl, halo, or haloalkyl; and
$R_2$, $R_3$, $R_4$, $R_5$, and $R_6$ are independently selected from hydrogen, alkyl, alkenyl, halo, or haloalkyl, wherein one or more of $R_1$, $R_2$, $R_3$, $R_4$, $R_5$, or $R_6$ are optionally bonded with a second polyarylene ring structure to form a dimer.

17. The method of claim 15, wherein the polyarylene is 1,4-dimethylbenzene, 1,3-dimethylbenzene, 1,2-dimethylbenzene, toluene, 4-methyl styrene, 3-methylstyrene, 2-methylstyrene, 1,4-divinylbenzene, 1,3-divinylbenzene, 1,2-divinylbenzene, chlorinated polyarylene, [2,2]paracylcophane, or a combination thereof.

18. The method of claim 13, wherein the reaction cycle further comprises contacting the capacitor element with a gaseous co-reactant.

19. The method of claim 18, wherein the co-reactant includes a fluorohydrocarbon compound.

20. The method of claim 13, wherein the capacitor element is heated to a temperature of about 200° C. or less during the reaction cycle.

21. The method of claim 13, further comprising subjecting the capacitor element to one or more additional reaction cycles that include contacting the capacitor element with a gaseous precursor compound.

22. The method of claim 13, wherein the solid electrolyte includes a layer formed from a dispersion of conductive polymer particles.

23. The method of claim 13, wherein the solid electrolyte includes a layer formed by solution phase polymerization.

24. The method of claim 13, wherein the anode body includes tantalum and the dielectric includes tantalum pentoxide.

* * * * *